(12) United States Patent
Fucinato

(10) Patent No.: US 9,040,814 B2
(45) Date of Patent: May 26, 2015

(54) ANTI-REFLECTIVE COATING FOR PHOTOVOLTAIC CELLS

(71) Applicant: Emily Fucinato, Walnutport, PA (US)

(72) Inventor: Emily Fucinato, Walnutport, PA (US)

( * ) Notice: Subject to any disclaimer, the term of this patent is extended or adjusted under 35 U.S.C. 154(b) by 0 days.

(21) Appl. No.: 13/776,154

(22) Filed: Feb. 25, 2013

(65) Prior Publication Data

US 2014/0238477 A1    Aug. 28, 2014

(51) Int. Cl.
*H01L 31/00* (2006.01)
*H01L 31/0216* (2014.01)

(52) U.S. Cl.
CPC ........... *H01L 31/02168* (2013.01); *Y02E 10/50* (2013.01)

(58) Field of Classification Search
USPC ........................................................ 136/256
See application file for complete search history.

(56) References Cited

U.S. PATENT DOCUMENTS

| | | | |
|---|---|---|---|
| 4,767,195 A * | 8/1988 | Pepper | 359/276 |
| 2003/0035313 A1 * | 2/2003 | Lee et al. | 365/100 |
| 2010/0003528 A1 * | 1/2010 | Rozhin et al. | 428/429 |
| 2010/0071751 A1 * | 3/2010 | Kim et al. | 136/244 |
| 2012/0302700 A1 * | 11/2012 | Tao et al. | 525/69 |

OTHER PUBLICATIONS

Research Study by The AMOLF institute in Eindhoven, Netherlands entitled "Moth Eyes Inspire More Efficient Solar Cell", published Feb. 2009 by Physicsworld.com; http://physicsworld.com/cws/article/news/2009/feb/09/moth-eyes-inspire-more-efficient-solar-cell, pp. 1-2.

Shawn Lin, Research Study published from Rensselaer Polytechnic Institute, entitled "Solar Power Game-Changer: 'Near Perfect' Absorption of Sunlight, From All Angles", published Nov. 2008 by RPI News; http://news.rpi.edu/luwakkey/2507, pp. 1-4.

Kelzenberg, et al.; Research Study from Institute of Technology (Caltech) entitled "Enhanced Absorption and Carrier Collection in Si Wire Arrays for Photovoltaic Applications", published Feb. 2010, Nature Materials vol. 9, pp. 239-244, http://www.nature.com.ezaccess.libraries.psu.edu/nmat/journal/v9/n3/full/nmat2635.html.

* cited by examiner

*Primary Examiner* — Eli Mekhlin

(74) *Attorney, Agent, or Firm* — The Patentwise Group, LLC

(57) ABSTRACT

A surface of a photovoltaic cell is coated with a solution that includes barium titanate to reduce reflection of sunlight that is incident on the surface. The solution may include a base of polydimethylsiloxane and carbon nanotubes. The process may be used in the fabrication of new photovoltaic cell assemblies, or to retrofit existing assemblies in situ.

8 Claims, 6 Drawing Sheets

|  | SiH4 (sscm) | Power (W) | Thickness (A) | DepRate (A/S) | Voc (Volts) | FF | Jsc (mA/cm2) | Eff (%) |
|---|---|---|---|---|---|---|---|---|
| Control A | 20 | 20 | 2180 | 1.8 | 0.864 | 0.74 | 11 | 7 |
| Exper. A | 20 | 20 | 2180 | 1.8 | 0.864 | 0.74 | 11 | 7 |
| Control B | 20 | 30 | 4400 | 3.7 | 0.885 | 0.72 | 12.3 | 7.2 |
| Exper. B | 20 | 30 | 4400 | 3.7 | 0.734 | 0.82 | 12.82 | 7.8 |

FIG. 4

ANTI-REFLECTIVE COATING FOR PHOTOVOLTAIC CELLS

BACKGROUND OF THE INVENTION

1. Field of the Invention

The field of the invention is related to photovoltaic cells. In particular, the field of the invention is directed to coating photovoltaic cells.

2. Description of the Related Technology

Energy is defined as the ability to do work, and while viable energy is all around us, the ongoing challenge of mankind is to develop ways to harvest this energy. Alternative energy describes energy sources that do not burn fossil fuels in order to generate usable energy. Renewable energy is energy which comes from natural resources such as sunlight, wind, rain, tides, and geothermal heat, which are renewable or naturally replenished. This century especially has led to an increased interest in the development of both alternative and renewable energy sources, driven by the need for environmentally friendly energy sources. The frequently debated and highly controversial prospect of global warming serving as a threat to society is often the hot topic among scientists, engineers, and environmentalists across the globe. With such discussions, the focus often shifts to developing new technologies and investing in current renewable energy resources. Means of harnessing renewable energy include wind, tide, geothermal, hydroelectric, biomass, and solar energies, by the year 2050, the earth will require 14 Terawatts of energy per year to power the planet, and this demand will increase to 33 terawatts by the year 2100.

Sources of renewable energy are important in the today's economic and environmental climate. Providing it as cheaply as possible is an important factor in getting such sources of energy adopted.

Solar energy shows the most promising potential as a renewable energy source. Over 50% of the incoming solar energy that reaches the earth's atmosphere can be absorbed by land. Solar energy can realistically generate up to 600 terawatts annually, and shows the most promising potential as a renewable energy source. This is in comparison to wind, tide, geothermal, hydroelectric, and biomass energy sources, which have lower energy production rates. The amount of energy the sun currently produces is 35,000 times more than the amount of energy our planet consumes. Solar energy is easily harvested for practical purposes, such as the generation of electricity to power homes, buildings, and even entire cities. Researchers are currently developing solar cells to power automobiles and aircraft. Countries with an abundance of sunlight and a population currently without electricity represent the fastest growing market for solar energy. Researchers are continually looking for ways to develop new solar technologies that have the capability of harvesting sunlight into usable energy.

Photovoltaic (PV) cells provide a way to harvest solar energy. When light shines on a PV cell, it may be reflected, absorbed, or pass right through. But only the absorbed light generates electricity. The energy of the absorbed light is transferred to electrons in the atoms of the PV cell semiconductor material. With their newfound energy, these electrons escape from their normal positions in the atoms and become part of the electrical flow, or current, in an electrical circuit. A special electrical property of the PV cell—what is called a "built-in electric field"—provides the force, or voltage, needed to drive the current through an external load, such as a light bulb. Crystalline silicon PV cells are the most common photovoltaic cells in use today. They are also the earliest successful PV devices. Therefore, crystalline silicon solar cells provide a good example of typical PV cell functionality.

As FIG. 1 shows, a typical conventional photovoltaic cell 10 includes an aluminum base layer, an N-layer, an I-layer and a P-layer. A layer of transparent conductive oxide is attached to the P-layer, and a protective layer of transparent glass is provided at the top of the cell for admitting sunlight while protecting the internal components of the cell.

An important factor regarding photovoltaic cells is increasing their efficiency. One major obstacle that currently prevents maximum level efficiency in photovoltaic solar cells is reflection loss. To decrease reflection loss, most manufacturers etch the surface of a solar cell to roughen it. However, today's technology is rapidly expanding in pursuit of a more dependable way to decrease reflectivity in solar cells, particularly PV or photovoltaic cells.

A recent study, published in the Feb. 14, 2010 issue of Nature Materials, performed by researchers at California Institute of Technology (Caltech) demonstrated that Silicon nanowire arrays serve as a promising application for replacement of traditional silicon wafers in photovoltaic (solar) cells. Initial observations revealed that, "In order for Si wire arrays to achieve maximum absorption over the relevant wavelengths and incidence angles of solar illumination, the reflectivity of the Si surfaces must be reduced, and the light passing between the wires must be randomized." The researchers showed that silicon nanowires impregnated with $Al_2O_3$ particles, then coated with the antireflective material SiN, embedded in the clear, non-toxic polymer Polydimethylsiloxane (PDMS) illustrates enhanced absorption in photovoltaic cells. The two features of the experiment that allowed for an increase in absorption enhancement and collection efficiency can be attributed to the SiN reflective coating and $Al_2O_3$ particles.

Another study released on Nov. 5, 2008 done by researchers from Rensselaer Polytechnic Institute showcased the development of an anti-reflective coating that allows solar panels to absorb sunlight from almost any angle in the solar spectrum. According to Shawn-Yu Lin, leader of the team and Professor of Physics at Rensselaer, "This new anti-reflective coating consists of seven silicon layers positioned one on top of the other which makes the sunlight bend, and at the same time enhance the anti-reflective properties. The light that should be reflected is now captured thanks to these seven layers, which measure 50 nanometers to 100 nanometers. These anti-reflective layers who perform like a forest which captures the light between the trees are made of silicon dioxide and titanium dioxide nanorods." The coating is made of silicon dioxide and titanium dioxide nanorods positioned at an oblique angle. The downsides to their experimentation? "The anti-reflective coating requires multi-layer coatings which are slightly more complex than the typical single-layer ones," Lin told CNN. "The economics of modern day solar cells depends largely on the thickness of the substrate and the processing cost for making the junctions. Our coating has a thickness of 0.7 to 1 micrometer. The additional cost for incorporating our antireflective coating would be two to four percent of that for existing solar cells," Lin said. Besides the additional cost, the team also discovered that the nanorods they utilized are very fragile and unstable and are investigating new ways to add strength to them. Thirdly, as Professor Darren Bagnall from the Nanoscale Systems Integration Group at the UK's University of Southampton noted in response to the experiment's findings, "It's really only going to deliver maybe four or five percent more power from the solar cell." Bagnall also noted that the experiment tested the amount of light that's transmitted to the device, not the efficiency of the device itself. Finally, Jeremy Leggett, founder of Solar Century, a leading UK solar-energy company, was cautiously optimistic, stating, "I've seen this before from other university research groups and there is a world of difference between nice results in the lab and commercially viable products."

A third study released on Feb. 9, 2009 on physics world.com was performed by researchers at the AMOLF institute in Eindhoven, Netherlands. Researchers there developed an antireflective coating modeled after the nanostructure of a moth's eye, a bioengineering concept known as biomimicry. Researchers used gallium phosphate (GaP) nanorods on top of a GaP substrate, then measured reflection and transmission simultaneously, creating a metamaterial with optical properties that change gradually as a function of distance. According to research team leader and professor Gomez Rivas, "We showed for the first time that light transmission was dominant, with only a minor part of the [reduced] reflection linked with scattering losses and absorption."

Final conclusions can be drawn from the above experimentations that an antireflective coating positioned on photovoltaic solar panels reduces the amount of light that presently escapes the cell, optimizing the amount of wavelength light that can be absorbed by the solar cells and thus converted into energy. The loss of light (referred to as reflection loss) from photovoltaic cells currently account for 75% of the light initially absorbed by the photovoltaic device. Antireflective materials reduce the amount of light in forms of both heat and energy that outflow from solar cells. This allows for maximum absorption of light and thus enhances efficiency and practical performance of photovoltaic cells.

Therefore, there is a need in the field to provide means for increasing the efficiency of photovoltaic cells.

SUMMARY OF THE INVENTION

An object of the present invention is to increase the efficiency of photovoltaic cells.

An aspect of the present invention is an anti-reflective coating for photovoltaic cells comprising: barium titanate; and single walled carbon nanotubes.

Another aspect of the present invention is a photovoltaic cell comprising: a first surface; and an anti-reflective coating placed on the first surface, wherein the anti-reflective coating comprises barium titanate; and single walled carbon nanotubes.

Still yet another aspect of the present invention is a method of coating a photovoltaic cell comprising: forming a coating solution of barium titanate crystals and single walled carbon nanotubes placed in polydimethylsiloxane; coating a photovoltaic cell with the coating solution; and heating the photovoltaic cell.

These and various other advantages and features of novelty that characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

FIG. 4 is a chart showing the results of the experiment.

DETAILED DESCRIPTION OF THE PREFERRED EMBODIMENT(S)

Figure 1:
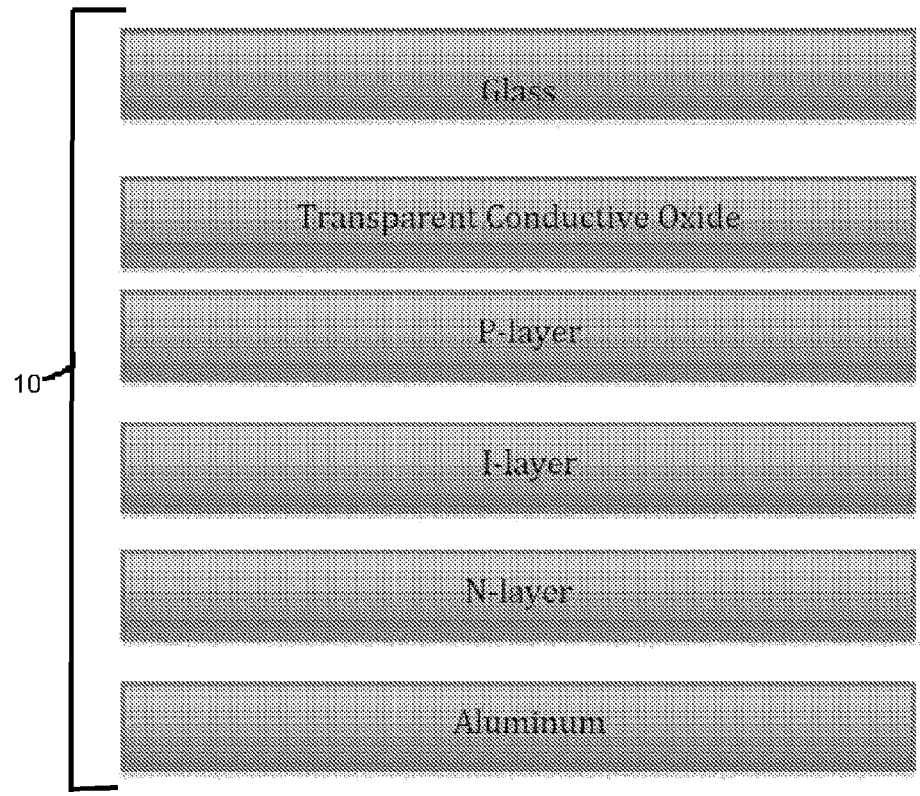
FIG. 1 shows a diagram of a layer of a silicon photovoltaic cell.
Figure 2:
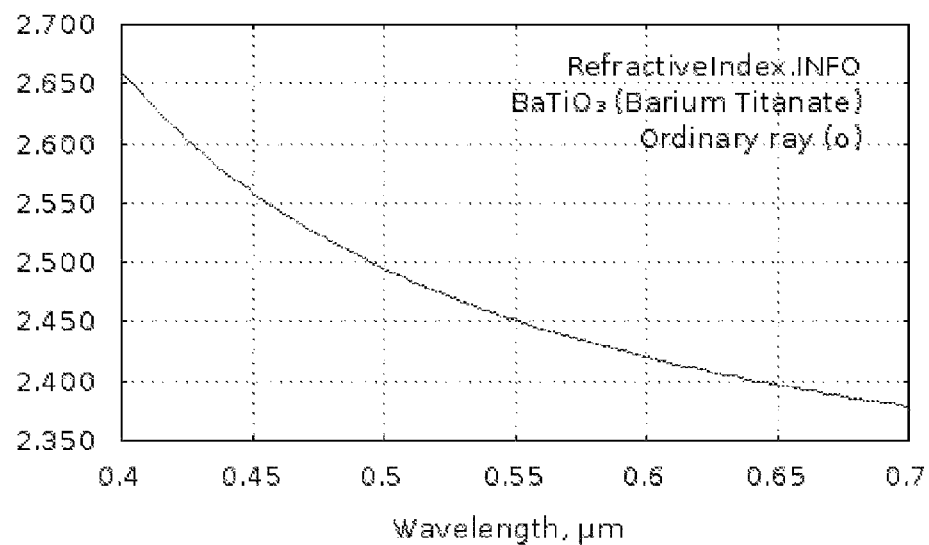
FIG. 2 is a graph showing the refractive index of barium titanate.
Figure 3:
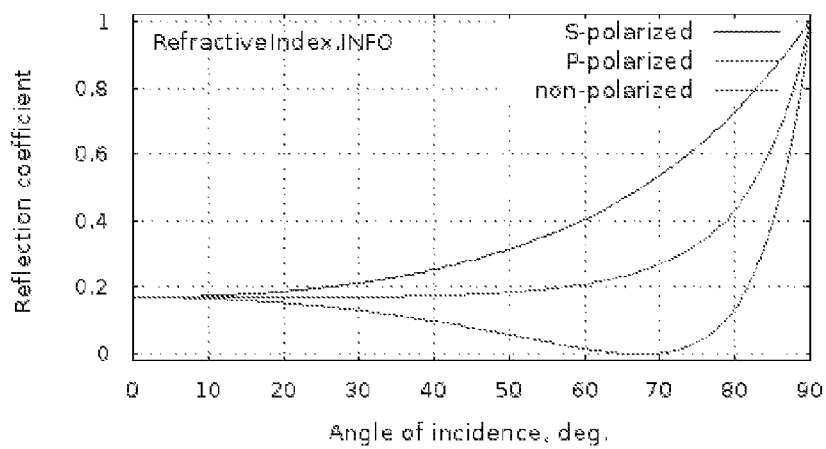
FIG. 3 is a graph showing reflection coefficient vs. the angle of incidence.
Figure 5:
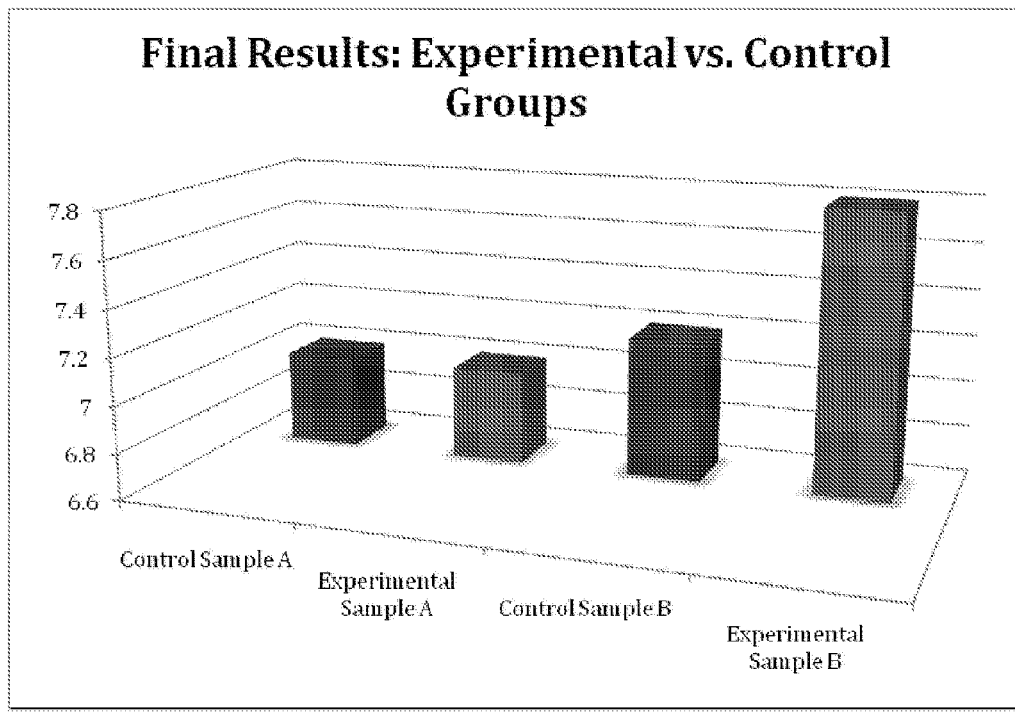
FIG. 5 is a graph showing the final results of the experiment.

This present invention varies from the above discussed references in a variety of ways. One way is that the above experiments above utilized gallium nanorods, silicon wires or silicon layers as the base material for their antireflective coating. The limitations of silicon, fragileness of nanorods, and high cost of multiple layers of solar cells create problems. This invention utilizes carbon nanotubes as an antireflective coating. Carbon nanotubes are show promising potential in the photovoltaic field in the development of anti-reflective surfaces due to their high thermal conductivity, strength as a semiconductors, strength, and high optical absorption. Recent observations and henceforth deductions of appropriated material have led to the belief that carbon nanotubes' efficiency as thermal conductors and unique electrical properties will enable them to competently absorb more light that traditional photovoltaic solar cells, increasing their overall absorption rate, not just absorption and anti-reflectivity. Another difference is that in past, $Al_2O_3$ (aluminum oxide) particles have been used to randomize the light passing through the solar cell. The present invention utilizes carbon nanotubes embedded with barium titanate crystals, which have the ability to bend light at different angles.

The present invention is an anti-reflective coating for silicon photovoltaic cells, comprising barium titanate crystals and single-walled carbon nanotubes (SWCNTs) submerged in a base of Polydimethylsiloxane (PDMS).

Polydimethylsiloxane or PDMS, is the most widely utilized silicon-based organic polymer. It belongs to a group of organosilicon polymer compounds that are known commonly as silicones. Silicones are synthetic, inert compounds that are typically heat resistant. The ingredients in most silicones include carbon, hydrogen, and oxygen, along with silicon. Polydilethylsiloxane is known for its unusual rheological (flow) properties. It is clear and transparent in appearance, non-flammable, non-toxic, and is used for a wide array of applications. PDMS can be found in shampoos, adhesives, sealants, tapes, silicon grease, heat transfer fluids, lubricating oils, heat resistant tiles, caulking agents, and as anti-foaming agents in food. Common products that contain PDMS as an ingredient include silly putty, cosmetics, breast implants, and food additives for processed foods. Due to its viscosity level, at high temperatures, the PDMS behaves like a liquid similar to honey, while, when cooled, PDMS is a flexible, easily molded solid. PDMS also presents an external hydrophobic surface, which is resistant to water. This property allows the surface of the PDMS to resist impurities that might try to penetrate its layer. Solid PDMS samples (whether surface oxidized or not) will not allow aqueous solvents to infiltrate and swell the material. The chemical formula for PDMS is $CH_3[Si(CH_3)_2O]nSi(CH_3)_3$, where n is the number of repeating monomer $[SiO(CH_3)_2]$ units.

Single-Walled Carbon Nanotubes are thin, rolled sheets of graphite with a cylindrical nanostructure. Their name is derived from their size, as carbon nanotubes measure approximately 1/50,000 the width of a single human hair. The average length to diameter of a single carbon nanotube is 132,000,000:1. Nanotubes are chemically bonded entirely by sp2 bonds, which resemble those of graphite. These bonds give nanotubes their unique strength, since the bonds are stronger than the sp3 bonds found among alkanes.

Carbon nanotubes are classified into three different groups based on their structure: Armchair, zigzag, or chiral. The structure of the nanotube is determined by thinking of the nanotubes as vector quantities with both magnitude and direction. The way the sheets of graphite are wrapped to form the nanotube is represented by a set of points referred to as (m, m), known as the chiral vector. The integers N and M indicate the number of units along two directions in a crystal lattice of graphene. If m=0, the nanotubes are called zigzag. If n=m, the nanotubes are called armchair. Otherwise, they are called chiral. The diameter of a nanotube can be calculated from its (n,m) indices as follows:

$$d = \frac{a}{\pi}\sqrt{(n^2 + nm + m^2)}.$$

Carbon nanotubes are further classified as either single-walled or multi-walled. I utilized single-walled carbon nanotubes for my experiment, which have an average diameter close to one nanometer. Single-walled nanotubes are an important variety of carbon nanotube because they exhibit electric properties that are not shared by the multi-walled carbon nanotube (MWNT) variants. In particular, their band gap can vary from zero to about 2 eV and their electrical conductivity can show metallic or semiconducting behavior, whereas MWNTs are zero-gap metals.

Carbon Nanotubes are also allotropes of carbon that possess many astonishing properties, including those researchers believe will play an important role in the growing field of nanotechnology. Carbon Nanotubes serve as astonishing electrical conductors, are known for their high strength, since they are 117 times stronger than industrial steel. To date, they are the strongest and stiffest materials ever produced in terms of tensile strength and elastic modulus. The nanotubes are extremely flexible and able to be bent into different shapes, and have a high temp resistance, withstanding temperatures upwards of 2800° C. in vacuum & 750° C. in air. Additionally, carbon nanotubes exhibit hardness properties and can withstand pressures up to 24 GPa without deformation.

The nanotubes naturally align themselves into ropes held together by Van Der Waals forces. A Van der Waals force is the sum of the attractive or repulsive forces between molecules due to either covalent bonding or the electrostatic interaction of ions with one another. These forces differ from covalent and ionic bonding in that the Van der Waals forces are caused by correlations in the fluctuating polarizations of adjacent particles. The name Van der Waals is often used synonymously as the totality of intermolecular forces.

Barium titanate is an inorganic compound with the chemical formula $BaTiO_3$. Barium Titanate crystals are small, transparent crystals manufactured by heating potassium fluoride to 1100° C., or by heating barium carbonate and titanium dioxide. $BaTiO_3$ is a white powder that is viewed as transparent as larger crystals. Barium titanate is insoluble in water, and has a high melting point of 1625° C. A unique property of barium titanate crystals is their variable index of refraction, or the ability to bend light at different angles.

The crystals demonstrate the photorefractive effect, an optical effect seen in many different types of crystals that respond to light by altering their refractive index. The refractive index of a substance is the measure of the speed of light in that substance, expressed as a ratio of the speed of light in a vacuum relative to that in the considered substance.

Refraction of light at the interface between two media of different refractive indices, with $n_2 > n_1$. Since the phase speed is lower in the second medium ($v_2 < v_1$), the angle of refraction $\theta_2$ is less than the angle of incidence $\theta_1$; that is, the ray in the higher-index medium is closer to the normal.

Anti-Reflective Coatings are optical coatings applied to various surfaces to reduce or eliminate reflection and improve efficiency. Reflection is caused when a ray of light moves from one medium to another and some portion of the light is reflected between the two media. This can occur when light strikes the surface of a solar cell after traveling through air. Loss of light due to reflection in current PV cells is a major issue because it lowers the cell's efficiency. This is because a photovoltaic cell uses absorbed light to produce electricity. When light is lost due to reflection, less light is able to be absorbed by the PV cell, and thus less electricity is able to be produced. Anti-reflective coatings allow more light to be absorbed by the system. They improve the efficiency of the system since less light is lost to reflection and more light is absorbed within the media.

A single layer anti-reflection coating is non-reflective only at one wavelength, usually at the middle of the visible, while multiple layers are more effective over the entire visible spectrum. Thin film anti-reflection coatings greatly reduce the light loss in multi-element lenses by making use of phase changes and the dependence of the reflectivity on index of refraction. A single quarter-wavelength coating of optimum index can eliminate reflection at one wavelength. The idea behind anti-reflection coatings is that the creation of a double interface by means of a thin film gives you two reflected waves. If these waves are out of phase, they partially or totally cancel. If the coating is a quarter wavelength thickness and the coating has an index of refraction less that the glass it is coating then the two reflections are 180 degrees out of phase.

The transmission properties of a coating are dependent upon the wavelength of light being used, the substrate's index of refraction, the index of refraction of the coating, the thickness of the coating, and the angle of the incident light. Anti-reflective coatings work by creating a relative phase shift that measure 180° between the beam reflected at the upper and lower boundary of the thin film. Destructive interference between the two reflected beams occurs, cancelling both beams before they exit the surface. The optical thickness of the coating must be an odd number of quarter wavelengths ($\lambda/4$, where $\lambda$ is the wavelength being optimized for peak performance), in order to achieve the desired path difference of one half wavelength between the reflected beams, which leads to their cancellation.

When specifying an AR coating to suit your specific application, you must first be fully aware of the full spectral range of your system. While an AR coating can significantly improve the performance of an optical system, using the coating at wavelengths outside the design wavelength range could potentially decrease the performance of the system.

Previously, researchers have developed anti-reflective coatings made of materials ranging from silicon to gallium phosphate, in the forms of nanowires or nanorods. The downsides with these experiments have been the material choices, due to their fragility or inability to withstand high temperatures.

An experiment was conducted to determine if a coating made of $BaTiO_3$ crystals and SWCNTs would increase the efficiency of a photovoltaic cell.

The experiment was divided into 2 different groups: the control group and the experimental group. The control group consisted of 2 silicon PV solar cells without any optical coating. The silicon photovoltaic cells used in the experiment were monocrystalline silicon photovoltaic cells. Other types of photovoltaic cells may be used. In the previous year's experiment, I utilized monocrystalline silicon (mono-Si) photovoltaic cells. Monocrystalline silicon is from a family of silicons known as wafer, or bulk, silicons. The family includes both monocrystalline and polycrystalline silicon (poly-Si), Not only monocrystalline silicon but also a variety of thin film silicons can be used. Types of thin-film silicon that could be used include: 1) Amorphous Silicon (a-Si), 2) Protocrystalline Silicon, 3) Nanocrystalline Silicon (nc-Si), also known as Microcrystalline Silicon mc-Si), 4) Black Silicon, and 5) Micromorphous Silicon.

The experimental group consisted of 2 silicon PV cells coated with a 3 mL solution of SWCNTs and PDMS. Each solution contained a different concentration of $BaTiO_3$ crystals. Solution A contained 105 mg of $BaTiO_3$ crystals and Solution B contained 485 mg of $BaTiO_3$ crystals.

Figure 6:
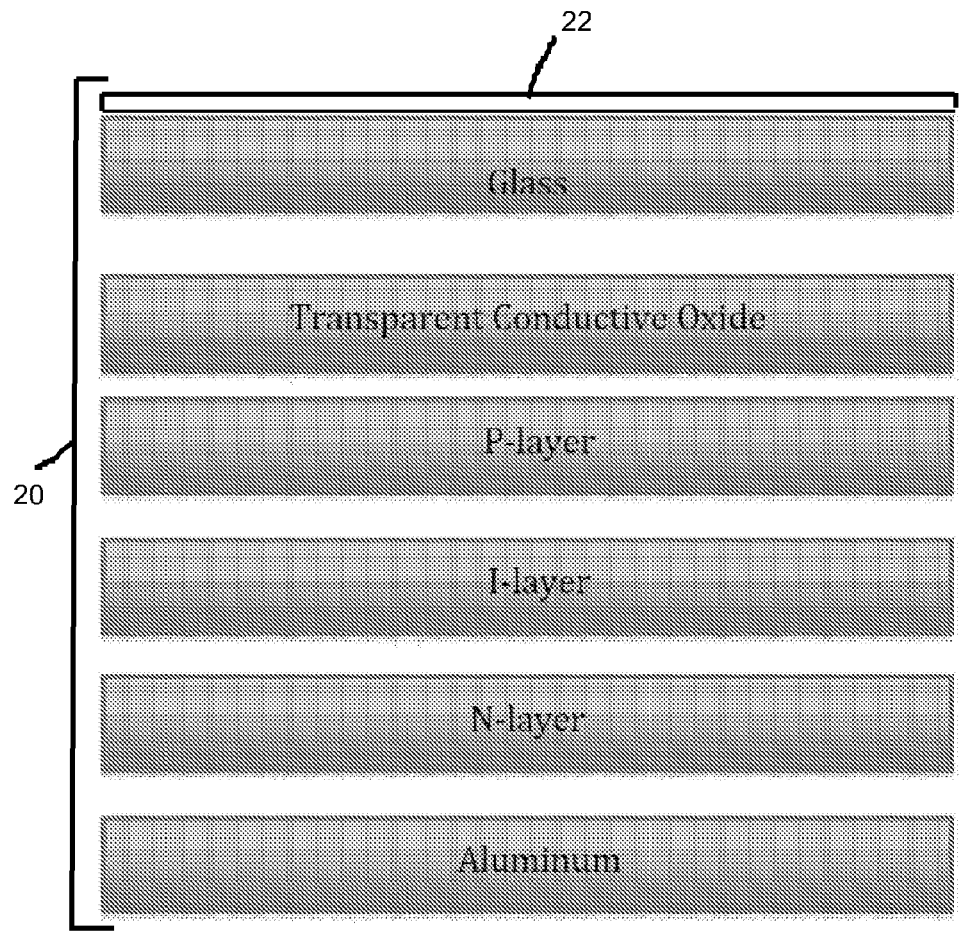
FIG. 6 is a diagram of a layer of photovoltaic cell after an anti-reflective coating has been applied according to a preferred embodiment of the invention.
Figure 7:
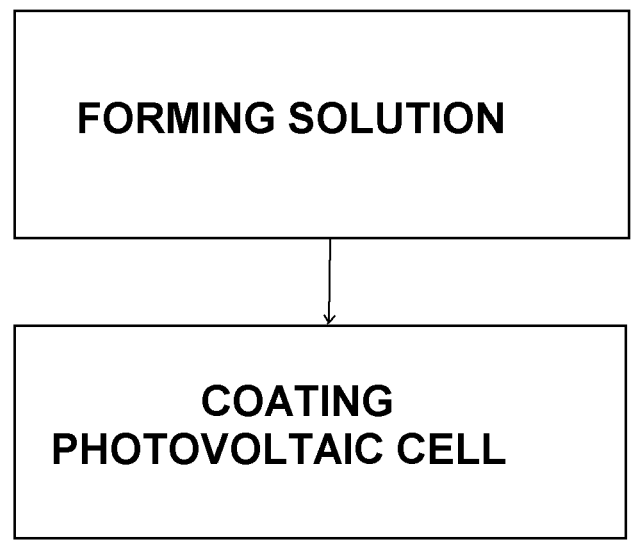
FIG. 7 is a flowchart depicting a method according to a preferred embodiment of the invention.

FIG. 6 depicts one of the coated PV cells 20. It includes an aluminum base layer, an N-layer, an I-layer and a P-layer. A layer of transparent conductive oxide is attached to the P-layer, and a protective layer of transparent glass is provided at the top of the cell for admitting sunlight while protecting the internal components of the cell. The anti-reflective coating 22 was applied to the outer surface of the layer of glass.

Neither of the two control samples underwent any procedure. There were two stages to the experimental group procedure. The first stage was to prepare the anti-reflective coating mixture. A gram scale was used to weigh out two samples of $BaTiO_3$ crystals in vials. Sample A contained 105 mg and Sample B contained 485 mg. Second, a 3 mL solution of premixed PDMS and SWCNTs was added to the vials containing the $BaTiO_3$ crystals. The second stage of the procedure was to place the 2 different solutions on the photovoltaic devices. The experimental PV cells were placed independently into a spin coater, the solution of $BaTiO_3$ crystals, SWCNTs, and PDMS was added, and ran the spin coater at 3300 rpm for approximately 10 s. Then, both experimental samples were placed in petri dishes in an oven set at 120° C. for 1 hr.

In the alternative embodiment of the invention, the antireflective coating can be applied in situ to photovoltaic cells that have already been deployed. This could increase the efficiency of existing installations without requiring removal and replacement of the photovoltaic cells that have already been installed. The coating could be applied by spraying, brushing or by applying it to a separate transparent film that is subsequently applied to a surface of the photovoltaic cell or a protective glass surface.

The efficiency measurements for the photovoltaic cells were conducted using a spectroscopic ellipsometer, which measures the refractive index of thin films using non-destructive and contactless techniques.

This table shown in FIG. 4 displays the efficiency measurements from the experiment, calculated using the above equations. The data in white boxes represents the control group, and the data in yellow represents the experimental group. The final column shows the efficiency ratings. Experimental group sample B, which contained the higher concentration of barium titanate crystals, shows a significant increase in overall efficiency from its control group counterpart, amounting to 8.3% overall increase in efficiency.

The first column of the results table is labeled "SiH4 (sscm)". This represents the amount of the gas silane contained per standard cubic centimeter in the area of space in which the efficiency measurements were determined.

The second column is labeled "Power (W)". This demonstrates the amount of power in watts, defined as 1 joule/second. The power in watts can easily be converted to the power density and measures the rate of energy conversion.

The third column labeled "Thickness (A)" represents the thickness of the intrinsic layers in angstroms. Angstroms are measured in terms of $10^{-10}$, while nanometers are measured in terms of $10^{-9}$. The thickness of the intrinsic layer in silicon PV devices ranges from 20-30 nm in diameter and 7-9 nm thick. Both the P and N layers also have fixed amounts, ranging from 35-50 nm thick.

The fourth column labeled "Dep Rate (A/S)" stands for deposition rate in angstroms per second, or how fast the intrinsic layers grow.

The fifth column labeled "Voc (Volts)" describes the open circuit voltage, or the difference of electrical potential between two terminals of a device. Specifically, in solar cells, the open circuit voltage describes the maximum voltage available from a solar cell that occurs at zero current.

The sixth column labeled "FF" stands for fill factor, which is calculated using the above equations and represents the ratio given as a percent, of the actual maximum attainable power given off by a solar cell device, to the theoretical (not actually attainable) power. This is key in evaluating the performance levels of all solar cells and along with efficiency rating, determines the energy yield of a photovoltaic cell.

The seventh column labeled "Jsc (mA/cm2)" stands for Short Circuit Joules, or the current. The current describes how many electrons are going through a specific plane in a given amount of time.

The eighth column labeled "Eff (%)" gives the efficiency in percentages for all four PV devices, from both the experimental and control groups.

PV cell A with the experimental coating absorbed the same amount of light and displayed an equal efficiency rating as the control group PV cell without a coating. PV cell B with the experimental coating and a higher concentration of crystals, absorbed more light and had a higher efficiency rating than the PV cell without a coating. PV cell B demonstrated the success of the anti-reflective coating, with an 8.3% increase in overall efficiency.

The success of the anti-reflective coating is believed to be due to the unique properties of the carbon nanotubes and the barium titanate crystals.

Accordingly, the high strength and temperature resistance of the nanotubes, paired with the ability of the crystals to bend light at different angles, was a successful combination. The PDMS, a silicon organic polymer, served as the glue that held the single-walled carbon nanotubes and barium titanate crystals together.

The high strength of the carbon nanotubes, allowed them to hold the barium titanate crystals in place within the anti-reflective layer. The carbon nanotubes' high strength (117 times stronger than industrial steel and 30 times stronger than Kevlar) allowed them to serve as a firm backbone for the antireflective layer. The nanotubes are flexible, but not fragile, which amounted to the perfect combination of strength.

Their high temperature resistance played an important role in them surviving through extreme conditions and makes them perfect candidates for use within solar panels, which must withstand high temperatures for extended periods of time. Furthermore, the carbon nanotubes were able to conduct electricity efficiently within the PV device, due to their excellence as conductors.

The refractive index of the barium titanate crystals, or the ability to bend light at different angles is believed to have been a very important contributor to the high percentage increase in efficiency for the photovoltaic cells. It is believed that when light entered the photovoltaic cell, the barium titanate crystals evenly dispersed throughout the solution were able to scatter particles of light at all different angles through the PV device. This led to more light absorption within the PV device, and thus to a higher efficiency. The crystal's variable index of refraction allowed them to scatter light throughout the cell, instead of reflecting it back outside the cell, which in itself is a unique property.

Overall, the combination of the barium titanate crystals and carbon nanotubes was able to create a strong, efficient, anti-reflective coating that effectively managed to cut down reflection loss within photovoltaic devices. This led to an increased absorption of light, and thus, to a solar cell with a higher efficiency Practical applications of this invention include the development of a marketable product in the form of an anti-reflective coating that could be applied to silicon photovoltaic devices to increase their efficiency. The single-layer coating would be a lower-cost alternative to current ones and could even be applied to other optical surfaces such as eyeglasses, telescopes, camera lenses, and binoculars. I truly believe the results of this experiment show promise as a potential anti-reflective for current silicon photovoltaic devices. The data collected in this experiment for experimental sample B led to an 8.3% increase in efficiency over its control group counterpart; a substantial increase in the photovoltaic industry.

Such results could tremendously impact solar panel manufacturers and consumers of solar panels. Loss of light due to reflection is a major problem in current photovoltaic devices, with up to 30% of potential light lost to reflection. Applying effective anti-reflective coatings to the surface of solar panels would cut the need for extensive testing and efficiency measurements, increasing the efficiency of the photovoltaic cell. Single-layer anti-reflective coatings are much more cost effective than multi-layer coatings and increase the amount of sunlight able to be captured by the photovoltaic cell for energy conversion.

The practical applications of this project extend to fields outside of the alternative energy industry as well. Anti-reflective coatings are applied to various optical products, including eyeglass lenses, microscopes, telescopes, and binoculars. The experimental design of optical materials could be improved, leading to a more efficient product. The improved design of such products might eventually lead to increases in sales for a variety of optical businesses and corporations.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A photovoltaic cell comprising:
   a first surface; and
   an anti-reflective coating placed on the first surface, wherein the anti-reflective coating comprises a matrix with barium titanate crystals having a variable index of refraction and carbon nanotubes dispersed within the matrix.

2. A photovoltaic cell according to claim 1, wherein the carbon nanotubes comprise single walled carbon nanotubes.

3. The photovoltaic cell of claim 1, wherein the matrixes comprises polydimethylsiloxane.

4. The photovoltaic cell of claim 1, wherein the coating is fabricated using a solution that comprises greater than 100 mg of barium titanate per a 3 ml solution.

5. The photovoltaic cell of claim 4, wherein the coating is fabricated using a solution that comprises greater than 140 mg of barium titanate per a 3 ml solution.

6. A photovoltaic cell comprising:
   a first surface; and
   an anti-reflective coating placed on the first surface, wherein the anti-reflective coating comprises polydimethylsiloxane with barium titanate crystals having a variable index of refration and single walled carbon nanotubes dispersed within the polydimethylsiloxane.

7. The photovoltaic cell of claim 6, wherein the coating is fabricated using a solution that comprises greater than 100 mg of barium titanate per a 3 ml solution.

8. The photovoltaic cell of claim 7, wherein the coating is fabricated using a solution that comprises greater than 140 mg of barium titanate per a 3 ml solution.

* * * * *